(12) United States Patent
Baik et al.

(10) Patent No.: US 8,460,999 B2
(45) Date of Patent: Jun. 11, 2013

(54) NON-VOLATILE MEMORY DEVICES WITH MULTIPLE LAYERS HAVING BAND GAP RELATIONSHIPS AMONG THE LAYERS

(75) Inventors: Seung-Jae Baik, Seoul (KR); Hong-Suk Kim, Yongin-si (KR); Si-Young Choi, Seongnam-si (KR); Ki-Hyun Hwang, Seongnam-si (KR); Sang-Jin Hyun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 125 days.

(21) Appl. No.: 13/067,405

(22) Filed: May 31, 2011

(65) Prior Publication Data

US 2011/0237059 A1    Sep. 29, 2011

Related U.S. Application Data

(62) Division of application No. 12/216,945, filed on Jul. 14, 2008, now Pat. No. 7,973,355.

(30) Foreign Application Priority Data

Jul. 12, 2007    (KR) .................. 10-2007-0070152

(51) Int. Cl.
*H01L 21/336* (2006.01)
(52) U.S. Cl.
USPC .............. 438/261; 257/324; 257/E29.165; 257/E29.3
(58) Field of Classification Search
USPC ............ 257/315–317, 321, 324, 410, 411, 257/E29.162, E29.165, E29.17, E29.3, E29.304; 438/261, 264
See application file for complete search history.

(56) References Cited

U.S. PATENT DOCUMENTS

| 7,154,143 B2 | 12/2006 | Jung |
| 2006/0180851 A1 | 8/2006 | Lee et al. |
| 2006/0258090 A1* | 11/2006 | Bhattacharyya et al. ..... 438/257 |

(Continued)

FOREIGN PATENT DOCUMENTS

| KR | 10-0579844 | 5/2006 |
| KR | 10-0684900 | 2/2007 |

OTHER PUBLICATIONS

U.S. Office Action dated Jul. 22, 2010, issued in U.S. Appl. No. 12/216,945.

(Continued)

*Primary Examiner* — Matthew E Warren
(74) *Attorney, Agent, or Firm* — Harness, Dickey & Pierce, P.L.C.

(57) ABSTRACT

A nonvolatile memory device may include: a tunnel insulating layer on a semiconductor substrate; a charge storage layer on the tunnel insulating layer; a blocking insulating layer on the charge storage layer; and a control gate electrode on the blocking insulating layer. The tunnel insulating layer may include a first tunnel insulating layer and a second tunnel insulating layer. The first tunnel insulating layer and the second tunnel insulating layer may be sequentially stacked on the semiconductor substrate. The second tunnel insulating layer may have a larger band gap than the first tunnel insulating layer. A method for fabricating a nonvolatile memory device may include: forming a tunnel insulating layer on a semiconductor substrate; forming a charge storage layer on the tunnel insulating layer; forming a blocking insulating layer on the charge storage layer; and forming a control gate electrode on the blocking insulating layer.

20 Claims, 6 Drawing Sheets

U.S. PATENT DOCUMENTS

2006/0261401 A1 11/2006 Bhattacharyya
2007/0218663 A1* 9/2007 Hao et al. ...................... 438/532
2007/0281426 A1 12/2007 Wang
2012/0074486 A1* 3/2012 Lue et al. ...................... 257/324

OTHER PUBLICATIONS

U.S. Office Action dated Dec. 8, 2010, issued in U.S. Appl. No. 12/216,945.

* cited by examiner

NON-VOLATILE MEMORY DEVICES WITH MULTIPLE LAYERS HAVING BAND GAP RELATIONSHIPS AMONG THE LAYERS

CROSS-REFERENCE TO RELATED APPLICATION(S)

This application is a divisional of, and claims priority under 35 U.S.C. §120 to, U.S. application Ser. No. 12/216,945 filed Jul. 14, 2008 now U.S. Pat. No. 7,973,355, which claims priority to Korean Patent Application No. 10-2007-0070152, filed on Jul. 12, 2007, in the Korean Intellectual Property Office (KIPO), the entire contents of each of which are incorporated herein by reference.

BACKGROUND

1. Field

Example embodiments relate to semiconductor memory devices and methods for fabricating semiconductor memory devices. Also, example embodiments relate to nonvolatile memory devices with increased threshold voltage windows and methods for fabricating nonvolatile memory devices with increased threshold voltage windows.

2. Description of Related Art

Nonvolatile memory devices may be semiconductor memory devices that may retain the stored data even when not powered. A typical example of nonvolatile memory devices may be a flash memory device. A cell transistor of the flash memory device may have a charge storage layer interposed between a control gate and a semiconductor substrate, and/or the threshold voltage of the cell transistor may change depending on the quantity of charge stored in the charge storage layer. The flash memory device may use a threshold voltage difference, that may depend on the charge quantity of the charge storage layer, to discriminate the stored data.

As well known in the art, flash memory devices may be classified into a floating gate type and a charge trap type according to the structure of the charge storage layer. As the degree of integration increases, the floating gate flash memory device may be vulnerable to the problems of the inter-cell interference and/or the aspect ratio of a cell gate pattern. Therefore, the floating gate flash memory device may have a limitation in satisfying a commercial demand for high integration. The charge trap flash (CTF) memory device may use a thin layer with abundant trap sites as the charge storage layer. Therefore, the CTF memory device may have the advantages of requiring a simpler fabrication process and/or of having a lower cell gate pattern than a floating gate memory device using polycrystalline silicon.

A typical CTF memory device may have a tunnel insulating layer, a charge storage layer, a blocking insulating layer, and/or a control gate that may be sequentially stacked on a semiconductor substrate. Charges causing a threshold voltage difference may be charged/discharged into/from the charge storage layer, and/or the charge/discharge operation may be performed using a charge tunneling phenomenon in the tunnel insulating layer. The charge tunneling phenomenon may be controlled using a voltage applied to the control gate.

The voltage applied to the control gate may cause a back-tunneling phenomenon in which charges stored in the charge storage layer tunnel the blocking insulating layer and/or leak into the control gate. In order to reduce the back-tunneling phenomenon, a recently-proposed typical TANOS flash memory device may use an aluminum oxide layer and/or a tantalum nitride layer as a blocking insulating layer and/or a control gate, respectively. However, the typical TANOS flash memory device may have a limitation in implementing a multi-level cell (MLC) that has been recently proposed for high integration.

The MLC technology may be used to store multi-bit data in a single memory cell. To this end, a threshold voltage window, that may be defined as a threshold voltage difference between a program state and an erase state, may be required to be wide. In this context, the quantity Q of charge stored in a charge storage layer may be defined as the product of the capacitance C of a blocking insulating layer and a threshold voltage window $\Delta V_T$ (i.e., $Q=C\Delta V_T$). Thus, when the charge quantity Q of the charge storage layer is constant, an increase in the capacitance C of the blocking insulating layer may cause a decrease in the threshold voltage window $\Delta V_T$.

However, since the aluminum oxide layer used as the blocking insulating layer may have a high permittivity, it may be difficult to increase the threshold voltage window of the typical TANOS flash memory device.

SUMMARY

Example embodiments may provide charge trap flash (CTF) nonvolatile memory devices having a wide threshold voltage window.

Example embodiments also may provide methods for fabricating a CTF nonvolatile memory device having an increased threshold voltage window.

According to example embodiments, a nonvolatile memory device may include: a tunnel insulating layer on a semiconductor substrate; a charge storage layer on the tunnel insulating layer; a blocking insulating layer on the charge storage layer; and/or a control gate electrode on the blocking insulating layer. The tunnel insulating layer may include: a first tunnel insulating layer and a second tunnel insulating layer. The first tunnel insulating layer and the second tunnel insulating layer may be sequentially stacked on the semiconductor substrate. The second tunnel insulating layer may have a larger band gap than the first tunnel insulating layer.

According to example embodiments, a method for fabricating a nonvolatile memory device may include: forming a tunnel insulating layer on a semiconductor substrate; forming a charge storage layer on the tunnel insulating layer; forming a blocking insulating layer on the charge storage layer; and/or forming a control gate electrode on the blocking insulating layer. The tunnel insulating layer may include: a first tunnel insulating layer and/or a second tunnel insulating layer. The second tunnel insulating layer may have a larger band gap than the first tunnel insulating layer.

According to example embodiments, a nonvolatile memory device may include: a tunnel insulating layer on a semiconductor substrate; a charge storage layer on the tunnel insulating layer; a blocking insulating layer on the charge storage layer; and/or a control gate electrode on the blocking insulating layer. The tunnel insulating layer may include two or more layers. The highest energy level of the conduction band of the tunnel insulating layer may be adjacent to that of the charge storage layer. The difference between the highest energy level of the conduction band of the tunnel insulating layer and the energy level of the conduction band of the semiconductor substrate may decrease when a positive voltage is applied to the control gate electrode. The difference between the lowest energy level of the valence band of the tunnel insulating layer and the energy level of the valence band of the semiconductor substrate decreases when a negative voltage is applied to the control gate electrode.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF EXAMPLE EMBODIMENTS

Example embodiments will now be described more fully with reference to the accompanying drawings. Embodiments, however, may be embodied in different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

According to example embodiments, a high-dielectric layer may be used as a blocking insulating layer and/or a tunnel insulating layer may have a multi-layer structure. Thus, a threshold voltage window may be increased while maintaining a program voltage and/or an erase voltage constant.

A tunneling current flowing through the tunnel insulating layer may be a function of a threshold voltage and/or an electric field applied to the tunnel insulating layer. Specifically, the tunneling current may have an exponential dependency on the electric field applied to the tunnel insulating layer. As a result, the tunneling current may increase with a decrease in the threshold voltage of the tunnel insulating layer. Also, the tunneling current may increase with an increase in the electric field applied to the tunnel insulating layer.

Figure 1:
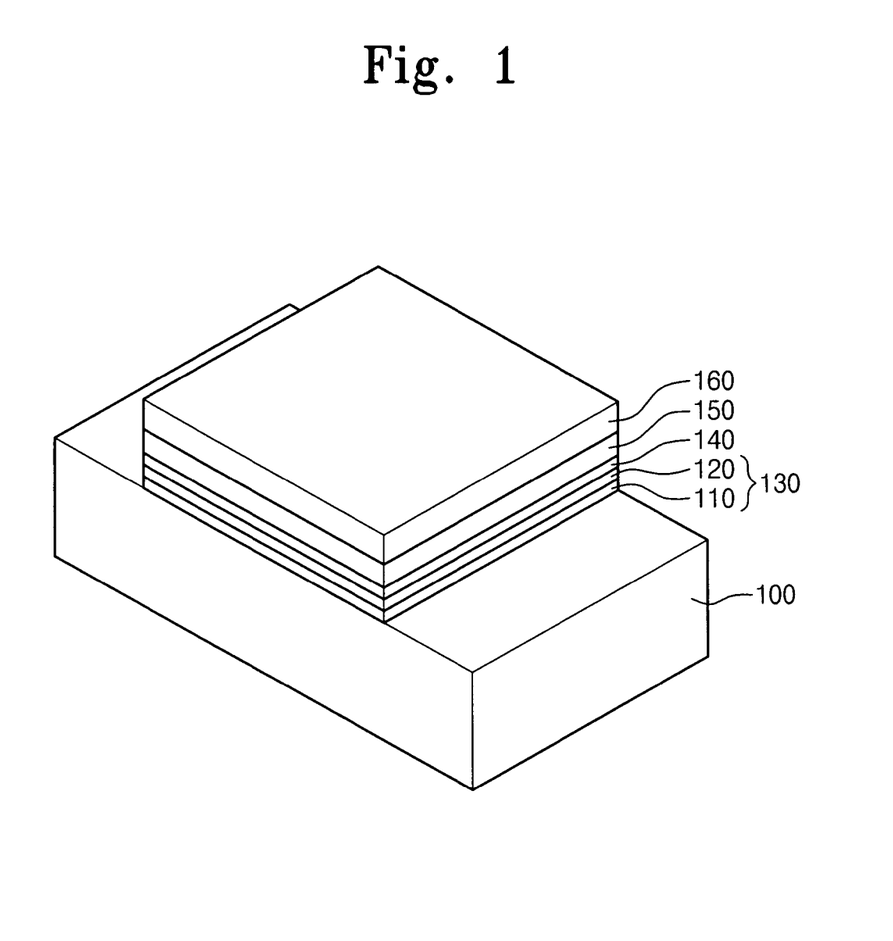
FIG. 1 is a perspective view of a nonvolatile memory device according to example embodiments.

FIG. 1 is a perspective view of a nonvolatile memory device according to example embodiments.

Referring to FIG. 1, a nonvolatile memory device according to example embodiments may include a tunnel insulating layer 130 on a semiconductor substrate 100, a charge storage layer 140 on the tunnel insulating layer 130, a blocking insulating layer 150 on the charge storage layer 140, and/or a control gate electrode 160 on the blocking insulating layer 150. The tunnel insulating layer 130 may include, for example, a first tunnel insulating layer 110 and/or a second tunnel insulating layer 120. The first tunnel insulating layer 110 and second tunnel insulating layer 120 may be, for example, sequentially stacked on the semiconductor substrate 100.

The semiconductor substrate 100 may include, for example, a monocrystalline silicon layer, a silicon-on-insulator (SOI) layer, a silicon layer on a silicon germanium (SiGe) layer, a monocrystalline silicon layer on an insulating layer, and/or a polycrystalline silicon layer on an insulating layer.

The first tunnel insulating layer 110 may include, for example, at least one silicon oxide layer, silicon oxide nitride (SiON) layer, and/or high-dielectric material(s). For example, the high-dielectric material for the first tunnel insulating layer 110 may include at least one of aluminum oxide ($Al_2O_3$ or $AlO_x$), hafnium oxide (HfO), hafnium aluminum oxide (HfAlO), hafnium silicon oxide (HfSiO), hafnium silicon oxide nitride (HfSiON), zirconium oxide (ZrO), and tantalum oxide ($Ta_2O$).

The second tunnel insulating layer 120 may include, for example, high-dielectric material(s). For example, the second tunnel insulating layer 120 may include at least one of an aluminum oxide ($Al_2O_3$ or $AlO_x$) layer, a hafnium oxide (HfO) layer, a hafnium aluminum oxide (HfAlO) layer, a hafnium silicon oxide (HfSiO) layer, a hafnium silicon oxide nitride (HfSiON) layer, a zirconium oxide (ZrO) layer, and a tantalum oxide ($Ta_2O$) layer.

According to example embodiments, a band gap $E_{g2}$ of the second tunnel insulating layer 120 may be larger than a band gap $E_{g1}$ of the first tunnel insulating layer 110. Also, a permittivity ratio $$\frac{\varepsilon_2}{\varepsilon_1}$$

of the second tunnel insulating layer 120 to the first tunnel insulating layer 110 may be greater than or equal to about 0.5:1. Thus, the materials for the first tunnel insulating layer 110 and/or the second tunnel insulating layer 120 may be selected so that the band gap $E_{g2}$ of the second tunnel insulating layer 120 is larger than the band gap $E_{g1}$ of the first tunnel insulating layer 110. Also, the materials for the first tunnel insulating layer 110 and/or the second tunnel insulating layer 120 may be selected so that the permittivity ratio $$\frac{\varepsilon_2}{\varepsilon_1}$$

of the second tunnel insulating layer 120 to the first tunnel insulating layer 110 may be greater than or equal to about 0.5:1.

The technical meanings of the above-described relations between the band gaps and the permittivities of the first and second tunnel insulating layers 110 and 120 will be described later in more detail with reference to FIGS. 2 through 6.

The charge storage layer 140 may be formed of a material having trap sites capable of storing charges. For example, the charge storage layer 140 may include at least one silicon nitride ($Si_3N$) layer, silicon oxide nitride (SiON) layer, and high-dielectric material(s). In addition, the charge storage layer 140 may include one or more of nano-crystalline silicon, nano-crystalline silicon germanium, nano-crystalline metal, germanium quantum dots, metal quantum dots, silicon quantum dots, and/or a stacked structure of one or more of them. Also, the charge storage layer 140 may have a metal trap site and/or a deep trap site formed in an energy band of the charge storage layer 140. The metal trap site may be formed, for example, by metal doping. The deep trap site may be formed, for example, by wet oxidation.

The blocking insulating layer 150 may include, for example, at least one silicon oxide layer, silicon oxide nitride (SiON) layer, and/or high-dielectric layer. The high-dielectric layer of the blocking insulating layer 150 has a higher permittivity than the tunnel insulating layer 130. The high-dielectric layer of the blocking insulating layer 150 may include, for example, at least one aluminum oxide ($Al_2O_3$ or $AlO_x$) layer, hafnium oxide (HfO) layer, hafnium aluminum oxide (HfAlO) layer, hafnium silicon oxide (HfSiO) layer, zirconium oxide (ZrO) layer, and/or tantalum oxide ($Ta_2O$) layer.

The control gate electrode 160 may include, for example, a conductive material having a work function larger than about 4 eV. For example, the control gate electrode 160 may include at least one of tantalum nitride (TaN), polycrystalline silicon (polysilicon), tungsten (W), tungsten nitride (WN), titanium nitride (TiN), and cobalt silicide ($CoSi_x$). The control gate electrode 160 may include other conductive materials.

Figure 2:
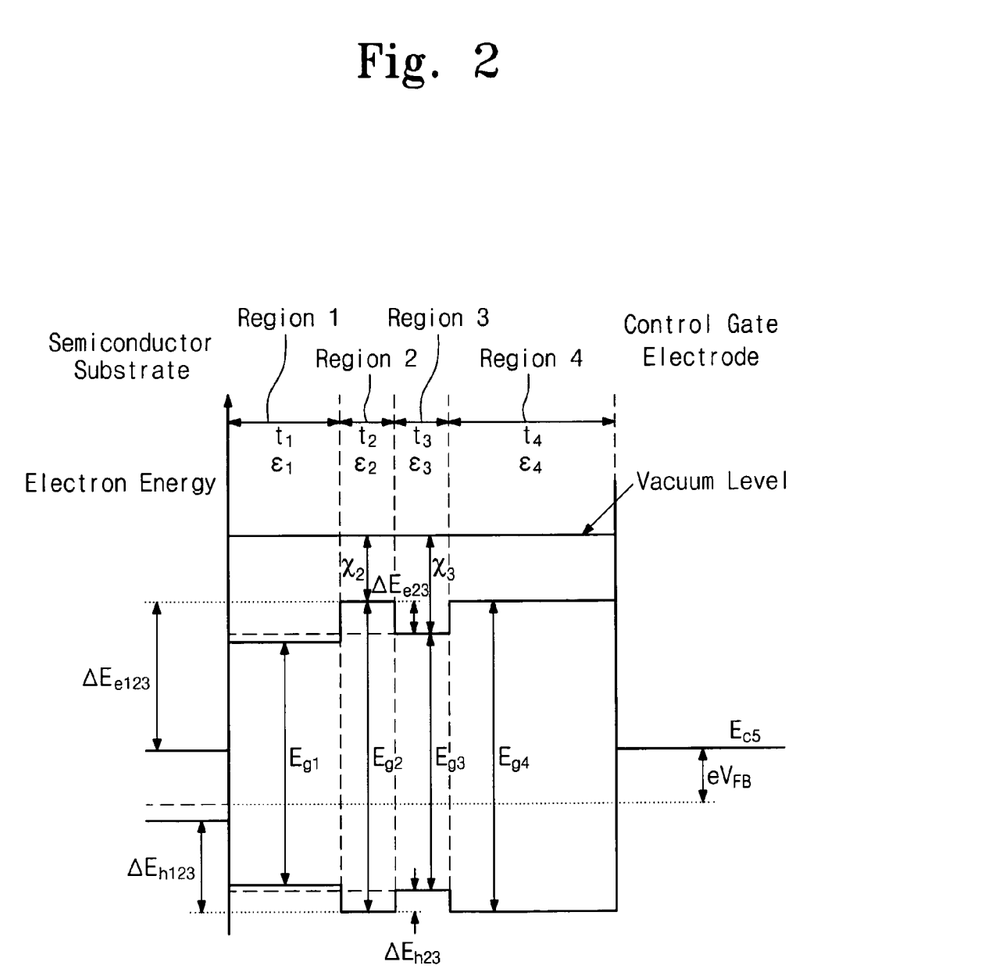
FIG. 2 is an energy band diagram of a nonvolatile memory device according to example embodiments.

FIG. 2 is an energy band diagram of a nonvolatile memory device according to example embodiments. Specifically, FIG. 2 may illustrate a case where a flat band voltage $V_{FB}$ is applied between the semiconductor substrate 100 and the control gate electrode 160 so that a Fermi level $E_{f0}$ of the semiconductor substrate 100 may be equal to the lowest energy level of a conduction band $E_{c5}$ of the control gate electrode 160. FIG. 2 may illustrate an exemplary case where p-type silicon, hafnium silicon oxide (HfSiO), aluminum oxide ($Al_2O_3$ or $AlO_x$), silicon nitride (SiN), and/or tantalum nitride (TaN) may be used respectively for the semiconductor substrate 100, the first tunnel insulating layer 110, the second tunnel insulating layer 120, the charge storage layer 140, the blocking insulating layer 150, and/or the control gate electrode 160.

In FIG. 2, a region of the first tunnel insulating layer 110 may be a first region and/or may have a permittivity $\varepsilon_1$ and/or a thickness $t_1$. A region of the second tunnel insulating layer 120 may be a second region and/or may have a permittivity $\varepsilon_2$ and/or a thickness $t_2$. A region of the charge storage layer 140 may be a third region and/or may have a permittivity $\varepsilon_3$ and/or a thickness $t_3$. A region of the blocking insulating layer 150 may be a fourth region and/or may have a permittivity $\varepsilon_4$ and/or a thickness $t_4$.

Referring to FIG. 2, the band gap $E_{g1}$ of the first tunnel insulating layer 110 may be smaller than the band gap $E_{g2}$ of the second tunnel insulating layer 120. Also, the band gap $E_{g2}$ of the second tunnel insulating layer 120 may be larger than the band gap $E_{g3}$ of the charge storage layer 140. The band gap $E_{g3}$ of the charge storage layer 140 may be smaller than the band gap $E_{g4}$ of the blocking insulating layer 150. Also, the electron affinity $x_3$ of the charge storage layer 140 may be larger than the electron affinity $x_2$ of the second tunnel insulating layer 120. The height $\Delta E_{e23}$ of an energy barrier for the electron of the charge storage layer 140 to tunnel the second tunnel insulating layer 120 may be different from the height $\Delta E_{h23}$ of an energy barrier for the hole of the charge storage layer 140 to tunnel the second tunnel insulating layer 120.

The threshold energy $\Delta E_{e123}$ for a conduction-band electron of the semiconductor substrate 100 to tunnel into the charge storage layer 140 may be different from the threshold energy $\Delta E_{h123}$ for a valence-band hole of the semiconductor substrate 100 to tunnel into the charge storage layer 140.

In example embodiments, the terms "energy" and "voltage" may be used in an interchangeable manner because an energy E and a voltage V may have a relationship of E=eV.

Figure 3:
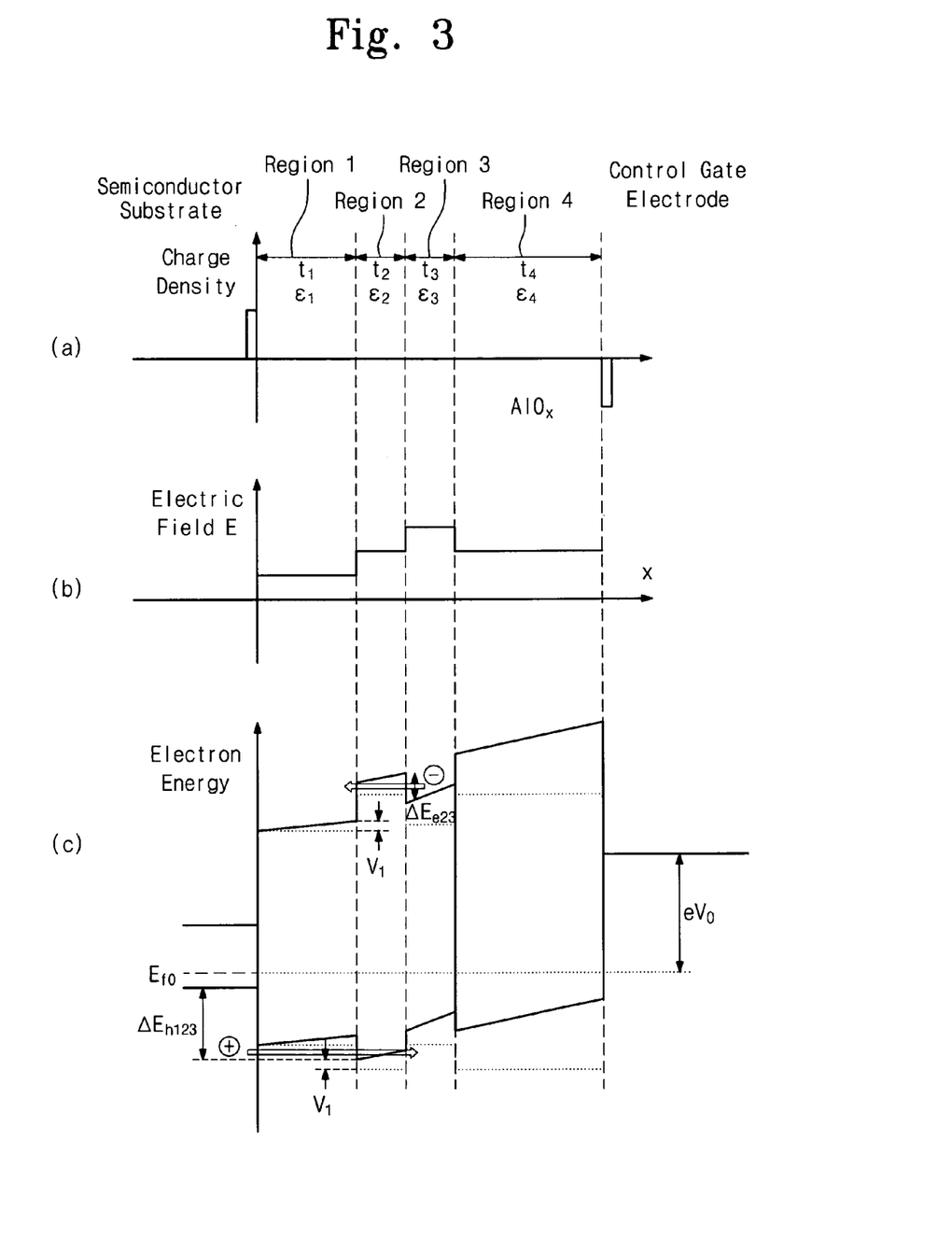
FIG. 3 is a diagram illustrating a charge density, electric field, and/or electron energy of a nonvolatile memory device in an erase state according to example embodiments.

FIG. 3 is a diagram illustrating a charge density (FIG. 3a), electric field (FIG. 3b), and/or electron energy (FIG. 3c) of a nonvolatile memory device in an erase state according to example embodiments. In FIGS. 2 and 3, like reference symbols may have like meanings.

Referring to FIG. 3a, charges stored in the charge storage layer 140 all may be removed by an applied erase voltage $V_0$. In this case, for example, surface charges may be present only in the semiconductor substrate 100 and/or the control gate electrode 160.

FIG. 3b may illustrate electric fields of the first tunnel insulating layer 110, the second tunnel insulating layer 120, the charge storage layer 140, and/or the blocking insulating layer 150 in the state where an erase operation is completed. For example, charges stored in the charge storage layer 140 all may be removed by an applied erase voltage $V_0$. The electric fields of the respective regions may be easily calculated using, for example, a capacitor voltage divider model.

When the erase operation is completed, the electric field of each region may be determined by the permittivity of each region on the basis of the boundary condition. Due to the permittivity difference, an electric field applied to the second tunnel insulating layer 120 (i.e., an aluminum oxide layer) may be larger than an electric field applied to the first tunnel insulating layer 110 (i.e., a hafnium silicon oxide layer). For example, the hafnium silicon oxide layer may have a dielectric constant of about 12 and/or the aluminum oxide layer may have a dielectric constant of about 10. For example, the dielectric constant may be defined as the ratio of the permittivity of the material to the permittivity of free space.

In the erase operation, a hole tunneling current of the semiconductor substrate 100 may depend on the electric fields applied to the first and second tunnel insulating layers 110 and 120 and/or the energy difference between the valence band of the semiconductor substrate 100 and the valence band of the second tunnel insulating layer 120 (i.e., the hole tunneling threshold energy $\Delta E_{h123}$).

Referring to FIG. 3c, the hole tunneling threshold energy $\Delta E_{h123}$ may be lower by a voltage drop $V_1$ of the first tunnel insulating layer 110 than the flat band energy illustrated in FIG. 2. Thus, there may be an increase in the tunneling current that results from tunneling of the holes of the semiconductor substrate 100 through the tunnel insulating layer 130. However, the threshold energy $\Delta E_{e23}$ for the electron of the charge storage layer 140 to tunnel the second tunnel insulating layer 120 may not change even when the erase voltage $V_0$ is applied.

Thus, a current flowing through the tunnel insulating layer 130 in the erase operation may be due to holes rather than electrons.

The electric fields applied to the first and second tunnel insulating layers 110 and 120 in the erase operation may be calculated using, for example, the capacitor voltage divider model.

That is, according to the capacitor voltage divider model, electric fields $E_1$ and/or $E_2$ and/or voltages $V_1$ and/or $V_2$ applied respectively to the first and second tunnel insulating layers 110 and/or 120 may be expressed as Equation (1):

$$E_1 = \frac{V_0}{t_1 + \varepsilon_1\left[\frac{t_2}{\varepsilon_2} + \frac{t_3}{\varepsilon_3} + \frac{t_4}{\varepsilon_4}\right]} = \frac{\frac{V_0}{\varepsilon_1}}{\frac{t_1}{\varepsilon_1} + \frac{t_2}{\varepsilon_2} + \frac{t_3}{\varepsilon_3} + \frac{t_4}{\varepsilon_4}} = \frac{V_0}{\varepsilon_1\left[\frac{EOT}{\varepsilon_{ox}}\right]} \quad [1]$$

$$V_1 = E_1 t_1 = \frac{\frac{t_1}{\varepsilon_1}V_0}{\frac{t_1}{\varepsilon_1} + \frac{t_2}{\varepsilon_2} + \frac{t_3}{\varepsilon_3} + \frac{t_4}{\varepsilon_4}} = \frac{\frac{t_1}{\varepsilon_1}}{\frac{t_1}{\varepsilon_1} + \frac{t_2}{\varepsilon_2}} V_{12}$$

$$E_2 = \frac{V_0}{t_2 + \varepsilon_2\left[\frac{t_1}{\varepsilon_1} + \frac{t_3}{\varepsilon_3} + \frac{t_4}{\varepsilon_4}\right]} = \frac{\frac{V_0}{\varepsilon_2}}{\frac{t_1}{\varepsilon_1} + \frac{t_2}{\varepsilon_2} + \frac{t_3}{\varepsilon_3} + \frac{t_4}{\varepsilon_4}} = \frac{V_0}{\varepsilon_2\left[\frac{EOT}{\varepsilon_{ox}}\right]}$$

$$V_2 = E_2 t_2 = \frac{\frac{t_2}{\varepsilon_2}V_0}{\frac{t_1}{\varepsilon_1} + \frac{t_2}{\varepsilon_2} + \frac{t_3}{\varepsilon_3} + \frac{t_4}{\varepsilon_4}} = \frac{\frac{t_2}{\varepsilon_2}}{\frac{t_1}{\varepsilon_1} + \frac{t_2}{\varepsilon_2}} V_{12}$$

where a region of the first tunnel insulating layer 110 may be a first region and/or may have a permittivity $\varepsilon_1$ and/or a thickness $t_1$, a region of the second tunnel insulating layer 120 may be a second region and/or may have a permittivity $\varepsilon_2$ and/or a thickness $t_2$, a region of the charge storage layer 140 may be a third region and/or may have a permittivity $\varepsilon_3$ and/or a thickness $t_3$, a region of the blocking insulating layer 150 may be a fourth region and/or may have a permittivity $\varepsilon_4$ and/or a thickness $t_4$, and/or an erase voltage is $V_0$.

For example, an effective silicon oxide thickness (EOT) may be expressed as Equation (2):

$$EOT = \varepsilon_{ox}\left(\frac{t_1}{\varepsilon_1} + \frac{t_2}{\varepsilon_2} + \frac{t_3}{\varepsilon_3} + \frac{t_4}{\varepsilon_4}\right) \quad (2)$$

where $\varepsilon_{ox}$ may denote the permittivity of a silicon oxide layer.

When the permittivity or thickness of the first tunnel insulating layer 110 increases, the electric field $E_1$ applied to the first tunnel insulating layer 110 may decrease. Also, when the permittivity or thickness of the second tunnel insulating layer 120 increases, the electric field $E_2$ applied to the second tunnel insulating layer 120 may decrease.

Meanwhile, when the thickness of the first tunnel insulating layer 110 increases, the voltage $V_1$ applied to the first tunnel insulating layer 110 may increase. When the permittivity of the first tunnel insulating layer 110 increases, the voltage $V_1$ applied to the first tunnel insulating layer 110 may decrease.

Also, when the thickness of the second tunnel insulating layer 120 increases, the voltage $V_2$ applied to the second tunnel insulating layer 120 may increase. When the permittivity of the second tunnel insulating layer 120 increases, the voltage $V_2$ applied to the second tunnel insulating layer 120 may decrease.

That is, when the permittivity of the first tunnel insulating layer 110 decreases, the electric field $E_1$ applied to the first tunnel insulating layer 110 may increase and/or a voltage drop $V_1$ across the first tunnel insulating layer 110 may increase. Accordingly, the hole tunneling threshold energy $\Delta E_{h123}$ may decrease by $V_1$ and/or the electric field $E_1$ applied to the first tunnel insulating layer 110 may increase, possibly increasing the hole tunneling current.

When the thickness of the first tunnel insulating layer 110 increases, the electric field $E_1$ applied to the first tunnel insulating layer 110 may decrease, but the voltage $V_1$ applied to the first tunnel insulating layer 110 may increase. Thus, there may be a limitation in increasing the thickness of the first tunnel insulating layer 110. That is, the first tunnel insulating layer 110 may have the optimal thickness because the hole tunneling current may be a function of the hole tunneling threshold energy $\Delta E_{h123}$ and/or the electric field $E_1$ of the first tunnel insulating layer 110. The optimal thickness of the first tunnel insulating layer 110 may depend on the permittivities of the first and/or second tunnel insulating layers 110 and 120.

When the characteristics (e.g., permittivities, thicknesses, and trap charge densities) of the charge storage layer 140 and/or the blocking insulating layer 150 and/or the permittivities of the first and/or second tunnel insulating layers 110 and 120 may be fixed and/or the EOTs of the first and/or second tunnel insulating layers 110 and 120 may be increased, the electric fields $E_1$ and/or $E_2$ applied to the first and/or second tunnel insulating layers 110 and 120 may decrease. For example, the voltage drop $V_1$ of the first tunnel insulating layer 110 may increase with an increase in the thickness of the first tunnel insulating layer 110.

Figure 4:
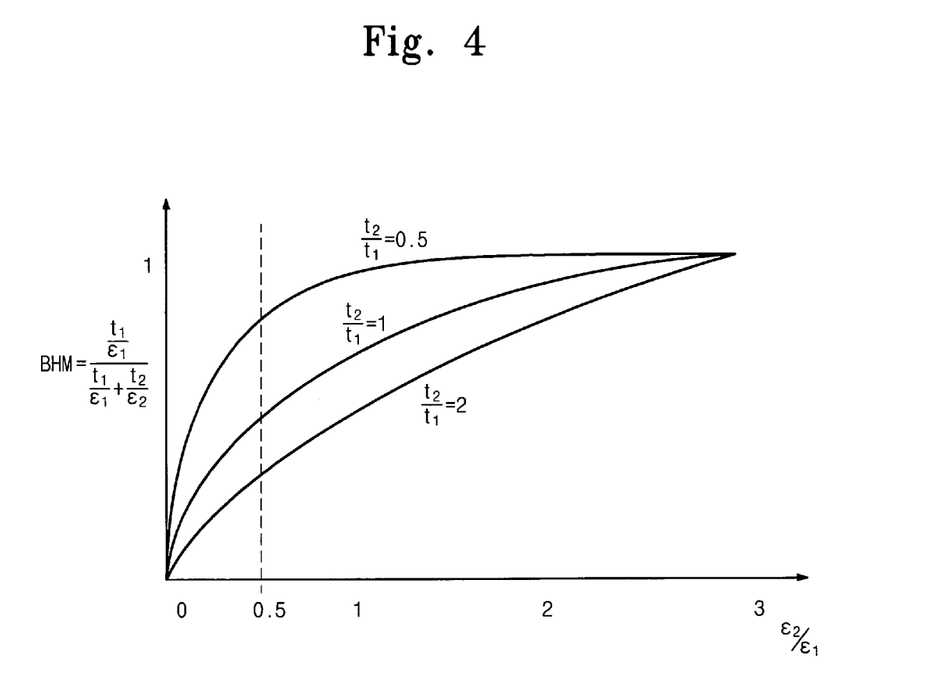
FIG. 4 is a graph illustrating a voltage drop of a first tunnel insulating layer depending on permittivity ratio and/or thickness ratio of a first tunnel insulating layer to a second tunnel insulating layer of a nonvolatile memory device according to example embodiments.

FIG. 4 is a graph illustrating the voltage drop $V_1$ of the first tunnel insulating layer 110 depending on permittivity ratio and/or thickness ratio of the first tunnel insulating layer 110 to the second tunnel insulating layer 120 of a nonvolatile memory device according to example embodiments. In FIGS. 2 and 4, like reference symbols have like meanings.

The tunnel insulating layer 130 may have a stacked structure. That is, the tunnel insulating layer 130 may include the first tunnel insulating layer 110 and/or the second tunnel insulating layer 120. FIG. 4 may illustrate the ratio of the voltage drop of the tunnel insulating layer 130 to the voltage drop of the first tunnel insulating layer 110 (i.e., a barrier height modulation (BHM) factor) depending on the permittivity ratio $$\frac{\varepsilon_2}{\varepsilon_1}$$

of the second tunnel insulating layer 120 to the first tunnel insulating layer 110. The BHM factor may be expressed as Equation (3):

$$V_1 = \frac{\frac{t_1}{\varepsilon_1}}{\frac{t_1}{\varepsilon_1} + \frac{t_2}{\varepsilon_2}} V_{12} = \frac{1}{1 + \frac{t_2}{t_1}\frac{\varepsilon_1}{\varepsilon_2}} V_{12} = BHM V_{12} \quad (3)$$

$$BHM = \frac{\frac{t_1}{\varepsilon_1}}{\frac{t_1}{\varepsilon_1} + \frac{t_2}{\varepsilon_2}}$$

When the permittivity ratio $$\frac{\varepsilon_2}{\varepsilon_1}$$

of the second tunnel insulating layer 120 to the first tunnel insulating layer 110 increases, the BHM factor may increase. When the BHM factor increases, the voltage $V_1$ applied to the first tunnel insulating layer 110 may increase. Thus, when the voltage $V_1$ increases, the hole tunneling threshold energy $\Delta E_{h123}$ may decrease, possibly increasing the hole tunneling current.

In general, the permittivity of an insulating layer may be related to the band gap of the insulating layer. That is, when the permittivity of an insulating layer increases, the band gap of the insulating layer may tend to decrease. For example, when a silicon oxide layer and/or an aluminum oxide layer are used respectively as the first tunnel insulating layer 110 and/or the second tunnel insulating layer 120, the band gap of the first tunnel insulating layer 110 may be larger than the band gap of the second tunnel insulating layer 120. In this case, for example, there may be no drop in the hole tunneling threshold energy. Thus, the hole tunneling threshold energy may drop when the band gap $E_{g1}$ of the first tunnel insulating layer 110 is smaller than the band gap $E_{g2}$ of the second tunnel insulating layer 120.

Therefore, in order to drop the hole tunneling threshold energy, the permittivity of the first tunnel insulating layer 110 may be larger than the permittivity of the second tunnel insulating layer 120, in the case of general materials. For example, the BHM factor may increase as the permittivity ratio $$\frac{\varepsilon_2}{\varepsilon_1}$$

of the second tunnel insulating layer 120 to the first tunnel insulating layer 110 increases.

According to example embodiments, a hafnium silicon oxide nitride (HfSiO$_x$N$_y$) layer and/or an aluminum oxide (Al$_2$O$_3$ or AlO$_x$) layer may be used respectively as the first tunnel insulating layer 110 and/or the second tunnel insulating layer 120. In this case, for example, the ratio of "x" to "y" may be adjusted to adjust the permittivity and/or band gap of the first tunnel insulating layer 110, and/or the permittivity ratio $$\frac{\varepsilon_2}{\varepsilon_1}$$

of the second tunnel insulating layer 120 to the first tunnel insulating layer 110 may range from about 0.5:1 to about 1:1.

According to example embodiments, an aluminum oxide (Al$_2$O$_3$ or AlO$_x$) layer and/or a silicon oxide (SiO$_2$) layer may be used respectively as the first tunnel insulating layer 110 and/or the second tunnel insulating layer 120. In this case, for example, the permittivity ratio $$\frac{\varepsilon_2}{\varepsilon_1}$$

of the second tunnel insulating layer 120 to the first tunnel insulating layer 110 may be about 0.37:1. For example, a drop in the hole tunneling threshold energy may be small because the BHM factor may be small.

Also, the BHM factor may change depending on the thickness ratio $$\frac{t_2}{t_1}$$

of the second tunnel insulating layer 120 to the first tunnel insulating layer 110. That is, the BHM factor may increase with a decrease in the thickness ratio $$\frac{t_2}{t_1}.$$

For example, as described above, an increase in the thickness of the first tunnel insulating layer 110 may decrease the electric field of the first tunnel insulating layer 110. Thus, in the erase operation, the hole tunneling current may allow the first tunnel insulating layer 110 to have the optimal thickness.

According to example embodiments, the BHM factor may be generalized even when the tunnel insulating layer 130 may have a stacked structure of 2 or more layers. That is, the BHM factor may be the ratio of the total voltage drop in the tunnel insulating layer 130 to a voltage drop in the remaining tunnel insulating layers except the tunnel insulating layer that may be most adjacent to the charge storage layer 140. When the tunnel insulating layer 130 has a stacked structure of 2 layers, the BHM factor may be the permittivity ratio $$\frac{\varepsilon_2}{\varepsilon_1}$$

of the second tunnel insulating layer 120 to the first tunnel insulating layer 110. When the tunnel insulating layer 130 has a stacked structure of 3 or more layers, the permittivity ratio may change to $$\frac{\varepsilon_3}{\varepsilon_{1\mathit{eff}}}.$$

The BHM factor may be generalized even when the tunnel insulating layer 130 may have a stacked structure of 4 or more layers. That is, the effective permittivity ratio of the generalized top tunnel insulating layer to the tunnel insulating layers under the generalized top tunnel insulating layer may be defined as a specific permittivity ratio. Thus, the specific permittivity ratio in the tunnel insulating layer 130 having a multi-layer structure may be greater than or equal to about 0.5:1.

$$BHM = \frac{\frac{t_{1\mathit{eff}}}{\varepsilon_{1\mathit{eff}}}}{\frac{t_{1\mathit{eff}}}{\varepsilon_{1\mathit{eff}}} + \frac{t_3}{\varepsilon_3}} \quad (4)$$

where $$\frac{t_{1\mathit{eff}}}{\varepsilon_{1\mathit{eff}}} = \frac{t_1}{\varepsilon_1} + \frac{t_2}{\varepsilon_2}.$$

Figure 5:
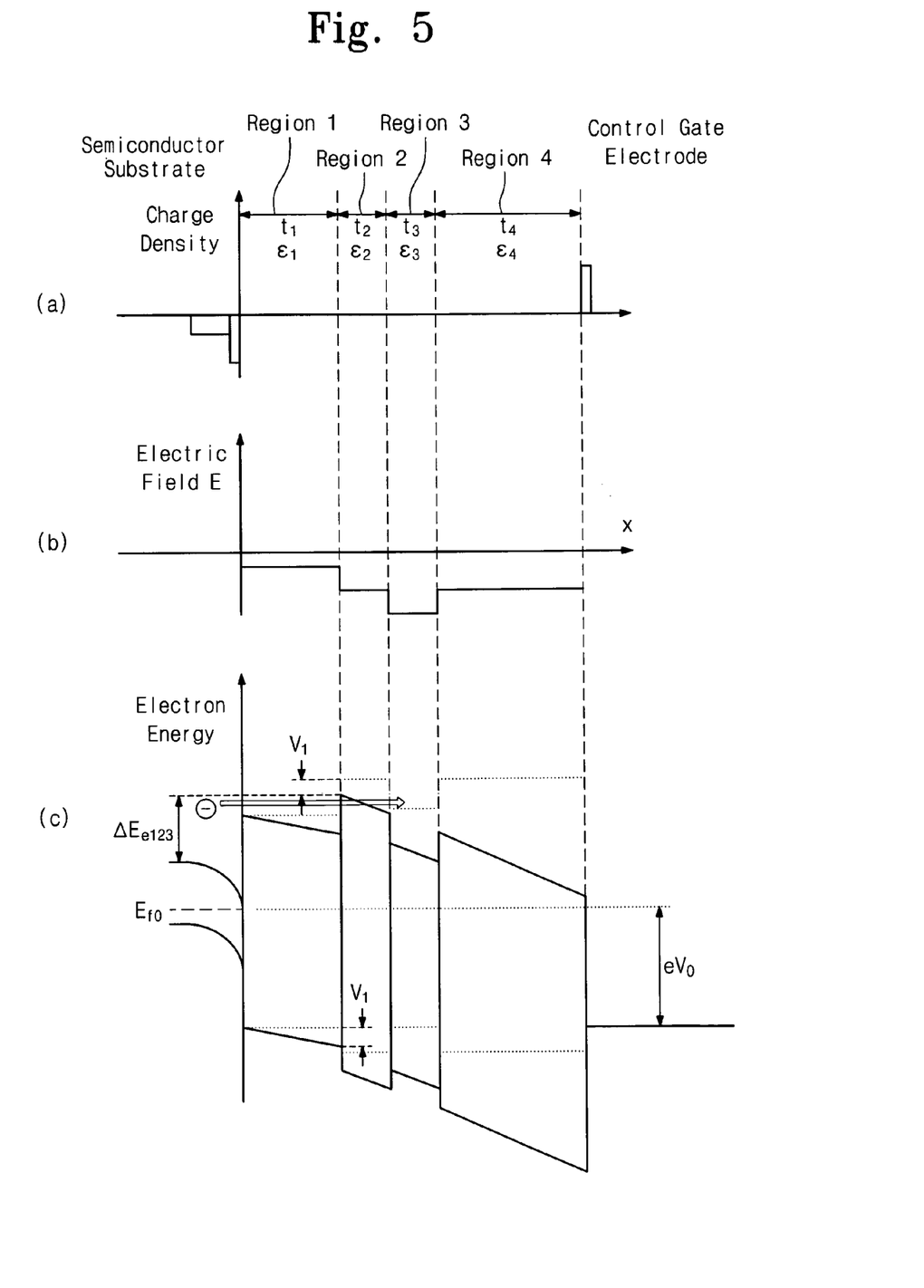
FIG. 5 is a diagram illustrating a charge density, electric field, and/or electron energy of a nonvolatile memory device in a program state according to example embodiments.

FIG. 5 is a diagram illustrating a charge density (FIG. 5a), electric field (FIG. 5b), and/or electron energy (FIG. 5c) of a nonvolatile memory device in a program state according to example embodiments. In FIGS. 2 and 5, like reference symbols have like meanings.

Referring to FIG. 5a, there may be no charge stored in the charge storage layer 140 immediately after a program voltage $V_0$ is applied. In this case, for example, charges may be present only in the semiconductor substrate 100 and/or the control gate electrode 160. The p-type semiconductor substrate 100 may be in a depletion state and/or may have negative space charges, and/or the surface of the semiconductor substrate 100 may be in an inversion state and/or may have surface charges.

FIG. 5b illustrates electric fields of the first tunnel insulating layer 110, the second tunnel insulating layer 120, the charge storage layer 140, and/or the blocking insulating layer 150 immediately after the program voltage $V_0$ is applied. If a voltage drop in the semiconductor substrate 100 due to its depletion state maybe disregarded, the voltages and/or the electric fields applied to the respective regions may be calculated using, for example, the capacitor voltage divider model, as described with reference to FIG. 3. Even when the surface potential of the semiconductor substrate 100 may be considered, the same result may be obtained by subtracting the surface potential of the semiconductor substrate 100 from the applied voltage.

The electric field of each region may be determined by the permittivity of each region on the basis of the boundary condition. Due to the permittivity difference, an electric field applied to the second tunnel insulating layer 120 (i.e., an aluminum oxide layer) may be larger than an electric field applied to the first tunnel insulating layer 110 (i.e., a hafnium silicon oxide layer).

Referring to FIG. 5c, an electron tunneling current of the semiconductor substrate 100 may depend on the electric fields applied to the first and/or second tunnel insulating layers 110 and 120 and/or the energy difference between the conduction band of the semiconductor substrate 100 and the conduction band of the second tunnel insulating layer 120 (i.e., an electron tunneling threshold energy $\Delta E_{e123}$).

The electron tunneling threshold energy $\Delta E_{e123}$ may be lower by a voltage drop $V_1$ of the first tunnel insulating layer 110 than the flat band energy illustrated in FIG. 2. Thus, there may be an increase in the tunneling current that may result from tunneling of the electrons of the semiconductor substrate 100 through the tunnel insulating layer 130. However, the threshold energy $\Delta E_{h23}$ for the hole of the charge storage layer 140 to tunnel the second tunnel insulating layer 120 does not change even when the program voltage $V_0$ is applied.

Thus, a current flowing through the tunnel insulating layer 130 in the program operation may be due to electrons rather than holes.

The electric fields applied to the first and/or second tunnel insulating layers 110 and 120 in the program operation may be calculated using, for example, the capacitor voltage divider model, as described with reference to FIG. 3.

Thus, the electron tunneling threshold energy for the first and/or second tunnel insulating layers 110 and 120 may be reduced by the voltage drop $V_1$ of the first tunnel insulating layer 110. The voltage drop $V_1$ of the first tunnel insulating layer 110 may have the same value as described with reference to FIG. 3.

However, also in the case of the application of the program voltage $V_0$, the electron tunneling threshold energy (or voltage) may drop when the band gap $E_{g1}$ of the first tunnel insulating layer 110 is smaller than the band gap $E_{g2}$ of the second tunnel insulating layer 120.

In general, the band gap of the insulating layer may be related to the permittivity of the insulating layer. Thus, the permittivity of the second tunnel insulating layer 120 may be smaller than the permittivity of the first tunnel insulating layer 110.

Figure 6:
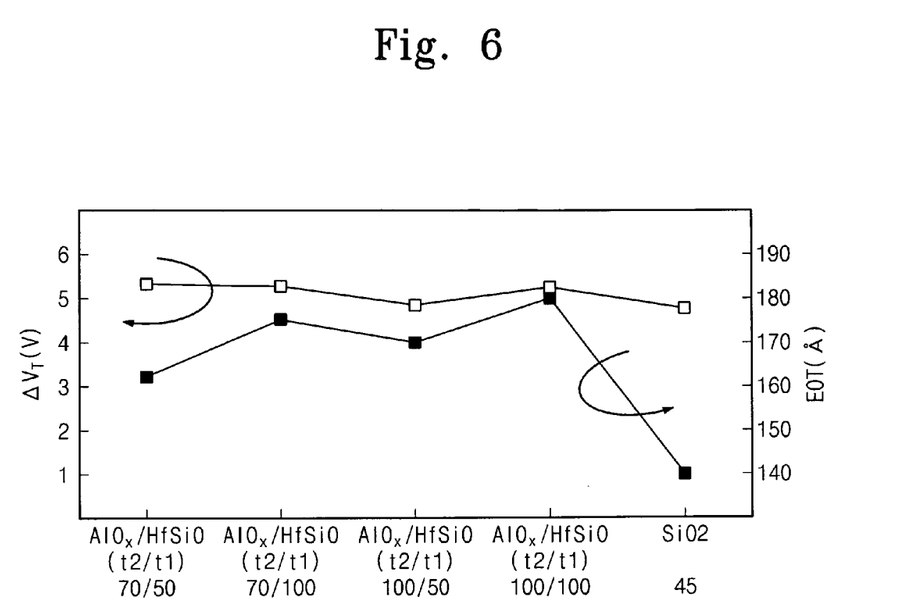
FIG. 6 is a graph illustrating a threshold voltage difference (i.e., a threshold voltage window) between a program state and an erase state and/or an effective silicon oxide thickness of an entire dielectric depending on thicknesses of a first tunnel insulating layer and/or a second tunnel insulating layer according to example embodiments.

FIG. 6 is a graph illustrating a threshold voltage difference (i.e., a threshold voltage window) between a program state and an erase state and/or an effective silicon oxide thickness of an entire dielectric depending on thicknesses of the first tunnel insulating layer 110 and/or the second tunnel insulating layer 120 according to example embodiments. In FIGS. 2 and 6, like reference symbols have like meanings.

Referring to FIG. 6, a hafnium silicon oxide (HfSiO) layer, an aluminum oxide ($Al_2O_3$ or $AlO_x$) layer, a silicon nitride layer, and an aluminum oxide layer may be used respectively as the first tunnel insulating layer 110, the second tunnel insulating layer 120, the charge storage layer 140, and/or the blocking insulating layer 150. In this case, for example, the program voltage and the erase voltage may use the same condition. Also, the charge storage layer 140 and the blocking insulating layer 150 may use the same condition even when the thicknesses of the first tunnel insulating layer 110 and/or the second tunnel insulating layer 120 change.

The effective silicon oxide thickness (EOT) of the entire dielectric may be $$EOT = \varepsilon_{ox}\left(\frac{t_1}{\varepsilon_1} + \frac{t_2}{\varepsilon_2} + \frac{t_3}{\varepsilon_3} + \frac{t_4}{\varepsilon_4}\right),$$

where $\in_{ox}$ may denote the permittivity of a silicon oxide layer. As described with reference to FIG. 3, the EOT may affect the electric field applied to the first tunnel insulating layer 110. However, in a CTF memory having first and second tunnel insulating layers, an increase in the EOT may not affect the threshold voltage difference ($\Delta V_T$), in principle.

Specifically, the threshold voltage difference ($\Delta V_T$) may be approximately expressed as Equation (5):

$$\Delta V_T = -\frac{\Delta Q_3}{C_4} \quad (5)$$

where $\Delta Q_3$ may denote the quantity of charge stored in the charge storage layer 140 and/or $C_4$ may denote the capacitance of the blocking insulating layer 150.

Thus, since the capacitance $C_4$ of the blocking insulating layer 150 may be maintained constant, the charge quantity $\Delta Q_3$ of the charge storage layer 140 may not change depending on the thicknesses of the first and/or second tunnel insulating layers 110 and 120, in principle. For example, in the case of a CTF memory using a single tunnel insulating layer, the threshold voltage difference $\Delta V_T$ may not change even when the thickness of the single tunnel insulating layer changes.

However, referring to FIG. 6, the threshold voltage difference $\Delta V_T$ may increase more when the tunnel insulating layer 130 has a multi-layer structure of high-dielectric layers than when the tunnel insulating layer 130 has a single-layer structure of a silicon oxide layer. It can be interpreted that an increase in the threshold voltage difference $\Delta V_T$, caused by the multi-layer structure of high-dielectric layers, may be attributed to the charge quantity $\Delta Q_3$ of the charge storage layer 140. That is, it may be interpreted that more charges are stored in the charge storage layer 140 in the case of the program state. Thus, the threshold voltage difference $\Delta V_T$ may increase with an increase in the charge quantity $\Delta Q_3$ of the charge storage layer 140. As described above, an increase in the charge quantity $\Delta Q_3$ of the charge storage layer 140 may be interpreted as a drop ($V_1$) in the electron tunneling threshold voltage.

Also, when the thickness ratio between the tunnel insulating layers changes, there may be no great dependency on the thickness ratio. As described with reference to FIG. 3, since an increase in the thickness of the first tunnel insulating layer 110 may not increase the voltage applied to the first insulating layer 110, but may decrease the electric field $E_1$ applied to the first tunnel insulating layer 110, the threshold voltage difference $\Delta V_T$ may not increase with an increase in the thickness of the first tunnel insulating layer 110. However, there may be an optimal thickness ratio of the first tunnel insulating layer 110 to the second tunnel insulating layer 120.

It may be seen that the tunnel insulating layer 130 having a multi-layer structure of high-dielectric layers may increase the EOT and/or that the threshold voltage difference $\Delta V_T$ may increase in spite of an increase in the EOT. As a result, the physical thickness of the tunnel insulating layer 130 may be increased and/or the thickness uniformity of the tunnel insulating layer may be advantageously secured.

Also, the nonvolatile memory device, which has the multi-layer tunnel insulating layer 130 using the phenomenon of a tunneling threshold energy drop, may increase the threshold voltage difference $\Delta V_T$ without changing the blocking insulating layer. Accordingly, an operating voltage in the read operation may be decreased and/or thus the device reliability may be increased.

According to example embodiments, the tunnel insulating layer 130 may not be limited to a two-layer structure but also may be applicable to a three-layer and/or more-than-three layer structure. For example, the band gap of the tunnel insulating layer 130 may increase toward the charge storage layer 140.

According to example embodiments, when the tunnel insulating layer 130 may have a three-layer structure, a third tunnel insulating layer adjacent to a charge storage layer may have a larger band gap than a first tunnel insulating layer adjacent to a silicon substrate, and/or a second tunnel insulating layer between the first and third tunnel insulating layers may have a larger band gap than the first tunnel insulating layer. In this case, for example, the above-described tunneling threshold energy drop may occur.

Referring again to FIG. 1, a method for fabricating the nonvolatile memory device according to example embodiments will be described in detail.

According to example embodiments, the first tunnel insulating layer 110 and/or the second tunnel insulating layer 120 may be processed by at least one of oxidation, fluoridation, and nitridation. These processes may contribute to reduce the bulk trap density in the first tunnel insulating layer 110 and/or the second tunnel insulating layer 120.

Specifically, the oxidation process may be performed in a gaseous atmosphere including oxygen. The oxidation process may be performed using at least one of rapid thermal oxidation, plasma oxidation, and ozone ($O_3$) oxidation. The fluoridation process may be performed in a gaseous atmosphere including fluorine. The fluoridation process may be performed using at least one of a thermal process and a fluorine ion implantation process. The nitridation process may be performed in a gaseous atmosphere including nitrogen. The nitridation process may be performed using at least one of rapid thermal nitridation and plasma nitridation.

According to example embodiments, the tunnel insulating layer 130, the charge storage layer 140, a blocking insulating layer 150, and/or a control gate conductive layer may be formed, and/or then a patterning process may be performed to form a control gate electrode 160. The nonvolatile memory device fabrication method may further include forming spacers (not illustrated) on the sides of the control gate electrode 160.

According to example embodiments, as described above, if the first tunnel insulating layer has a smaller band gap than the second tunnel insulating layer, the height of a tunneling barrier may be decreased when the erase voltage and/or the program voltage may be applied. Also, the threshold voltage window in the erase/program state may be increased accordingly. Also, the read voltage may be reduced because of the increase in the threshold voltage window. Therefore, the device reliability may be increased.

While example embodiments have been particularly shown and described, it will be understood by those of ordinary skill in the art that various changes in form and details may be made therein without departing from the spirit and scope of the present invention as defined by the following claims.

What is claimed is:

1. A method for fabricating a nonvolatile memory device, the method comprising:
   forming a tunnel insulating layer on a semiconductor substrate;
   forming a charge storage layer on the tunnel insulating layer;
   forming a blocking insulating layer on the charge storage layer; and
   forming a control gate electrode on the blocking insulating layer;
   wherein the tunnel insulating layer includes,
      a first tunnel insulating layer, and
      a second tunnel insulating layer stacked on the semiconductor substrate,
      wherein the second tunnel insulating layer has a larger band gap than the first tunnel insulating layer, and
      wherein the charge storage layer has a larger band gap than the first tunnel insulating layer.

2. The method of claim 1, wherein a permittivity ratio of the second tunnel insulating layer to the first tunnel insulating layer is greater than or equal to about 0.5:1.

3. The method of claim 1, wherein forming a tunnel insulating layer further comprises one or more of oxidation, fluoridation, and nitridation of the tunnel insulating layer.

4. The method of claim 3, wherein the oxidation comprises at least one of rapid thermal oxidation, plasma oxidation, and ozone oxidation.

5. The method of claim 3, wherein the nitridation comprises at least one of rapid thermal nitridation and plasma nitridation.

6. The method of claim 3, wherein the fluoridation comprises fluorine ion implantation.

7. The method of claim 1, wherein the second tunnel insulating layer has a smaller electron affinity than the charge storage layer.

8. The method of claim 1, wherein the second tunnel insulating layer has a larger band gap than the charge storage layer.

9. The method of claim 1, wherein the first tunnel insulating layer includes at least one zirconium silicon oxide nitride (ZrSiON) layer, silicon nitride ($Si_3N_4$) layer, silicon oxide nitride ($SiO_xN_y$) layer, or hafnium silicon oxide nitride (HfSiON) layer.

10. The method of claim 1, wherein the second tunnel insulating layer includes at least one aluminum oxide ($Al_2O_3$) layer, zirconium silicon oxide nitride (ZrSiON) layer, silicon nitride ($Si_3N_4$) layer, silicon oxide nitride ($SiO_xN_y$) layer, or hafnium silicon oxide nitride (HfSiON) layer.

11. The method of claim 1, wherein the first tunnel insulating layer includes,
   a hafnium silicon oxide nitride ($HfSiO_xN_y$) layer, and
   wherein the second tunnel insulating layer includes,
   an aluminum oxide ($AlO_x$) layer.

12. The method of claim 1, wherein the blocking insulating layer comprises:
   at least one aluminum oxide ($AlO_x$) layer, hafnium oxide ($HfO_x$) layer, or zirconium oxide ($ZrO_x$) layer.

13. The method of claim 1, wherein the charge storage layer comprises:
   at least one silicon nitride (SiN) layer, silicon oxide nitride (SiON) layer, or high-dielectric material.

14. A method for fabricating a nonvolatile memory device, the method comprising:
   forming a tunnel insulating layer on a semiconductor substrate;
   forming a charge storage layer on the tunnel insulating layer;
   forming a blocking insulating layer on the charge storage layer; and
   forming a control gate electrode on the blocking insulating layer;
   wherein the tunnel insulating layer includes,
      a first tunnel insulating layer, and
      a second tunnel insulating layer;
   wherein the first tunnel insulating layer and the second tunnel insulating layer are sequentially stacked on the semiconductor substrate;
   wherein the second tunnel insulating layer has a larger band gap than the first tunnel insulating layer; and
   wherein the blocking insulating layer has a larger band gap than the first tunnel insulating layer.

15. The method of claim 14, wherein a permittivity ratio of the second tunnel insulating layer to the first tunnel insulating layer is greater than or equal to about 0.5:1.

16. The method of claim 14, wherein the second tunnel insulating layer has a smaller electron affinity than the charge storage layer.

17. The method of claim 14, wherein the second tunnel insulating layer has a larger band gap than the charge storage layer.

18. A method for fabricating a nonvolatile memory device, the method comprising:
   forming a tunnel insulating layer on a semiconductor substrate;
   forming a charge storage layer on the tunnel insulating layer;
   forming a blocking insulating layer on the charge storage layer; and
   forming a control gate electrode on the blocking insulating layer;
   wherein the tunnel insulating layer includes,
      a first tunnel insulating layer, and
      a second tunnel insulating layer;
   wherein the first tunnel insulating layer and the second tunnel insulating layer are sequentially stacked on the semiconductor substrate;
   wherein the second tunnel insulating layer has a larger band gap than the first tunnel insulating layer; and
   wherein the blocking insulating layer has a larger band gap than the charge storage layer.

19. The method of claim 18, wherein the second tunnel insulating layer has a smaller electron affinity than the charge storage layer.

20. The method of claim 19, wherein the second tunnel insulating layer has a larger band gap than the charge storage layer.

* * * * *